United States Patent [19]
Fiddyment et al.

[11] Patent Number: 4,805,184
[45] Date of Patent: Feb. 14, 1989

[54] RIDGE WAVEGUIDE OPTICAL DEVICES

[75] Inventors: Philip J. Fiddyment; Leslie D. Westbrook, both of Ipswich; Andrew W. Nelson, Felixstowe, all of England

[73] Assignee: British Telecommunications, plc, London, England

[21] Appl. No.: 926,720

[22] Filed: Nov. 4, 1986

Related U.S. Application Data

[62] Division of Ser. No. 709,196, Mar. 7, 1985, Pat. No. 4,728,628.

[30] Foreign Application Priority Data

Mar. 12, 1984 [GB] United Kingdom ............... 8406432

[51] Int. Cl.$^4$ ............................................. H01S 3/19
[52] U.S. Cl. ............................... 372/96; 350/96.12; 357/17; 372/45
[58] Field of Search ..................... 372/44, 46, 45, 96; 350/96.12, 96.13, 96.14; 357/17

[56] References Cited

U.S. PATENT DOCUMENTS

| | | | |
|---|---|---|---|
| 4,011,113 | 3/1977 | Thompson et al. | 148/175 |
| 4,053,349 | 10/1977 | Simko | 156/628 |
| 4,061,530 | 12/1977 | Hosack | 156/653 |
| 4,161,701 | 7/1979 | Takeda et al. | 331/94.5 H |
| 4,178,604 | 12/1979 | Nakamura et al. | 372/96 |
| 4,230,997 | 10/1980 | Hartman et al. | 372/46 |
| 4,236,122 | 11/1980 | Cho et al. | 331/94.5 H |
| 4,269,635 | 5/1981 | Logan et al. | 148/171 |
| 4,341,010 | 7/1982 | Tijburg et al. | 29/580 |
| 4,354,898 | 10/1982 | Coldren et al. | 156/647 |
| 4,366,568 | 12/1982 | Shimizu et al. | 372/45 |
| 4,377,865 | 3/1983 | Sugino et al. | 372/45 |
| 4,390,393 | 6/1983 | Ghezzo et al. | 156/643 |
| 4,400,813 | 8/1983 | Kaminow | 372/45 |
| 4,463,493 | 8/1984 | Momose | 29/576 B |
| 4,465,532 | 8/1984 | Fukano | 156/643 |
| 4,468,850 | 9/1984 | Liau et al. | 29/569 |
| 4,545,114 | 10/1985 | Ito et al. | 29/579 |

FOREIGN PATENT DOCUMENTS

| | | |
|---|---|---|
| 2422287 | 11/1975 | Fed. Rep. of Germany . |
| 2643503 | 4/1977 | Fed. Rep. of Germany . |
| 2108753 | 5/1983 | United Kingdom . |

OTHER PUBLICATIONS

Electronics Letters, vol. 15, No. 23, 8th Nov. 1979, pp. 763-765, Hitchin, Herts, GB; I. P. Kaminow et al.: "Single-Mode C.W. Ridge-Waveguide Laser Emitting at 1.55 mum".

Electronics Letters, vol. 19, No. 20, 29th Sep. 1983, pp. 840-841, Hitchin, Hertz, GB; M. Kitamura et al.: "High-Power Single-Longitudinal-Mode . . .".

Primary Examiner—James W. Davie
Attorney, Agent, or Firm—Nixon & Vanderhye

[57] ABSTRACT

A semiconductor device is disclosed that comprises a base semiconductor portion and, thereon, first and second elevated semiconductor portions separated by a channel. The uppermost surface of the first elevated semiconductor portion carries a metal electrical contact layer and the uppermost of the second a dielectric layer. The surfaces defining the channel are substantially free of metal and dielectric. The structure can be used in a ridge waveguide laser, the first elevated semiconductor portion constituting the ridge. Distributed feedback corrugations may be incorporated in such devices or in other ridge waveguide structures.

19 Claims, 6 Drawing Sheets

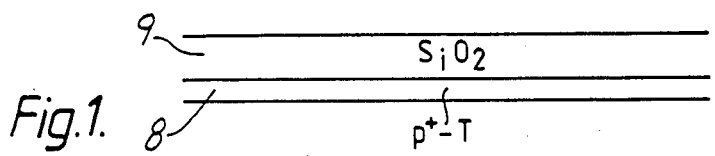
Fig.1.
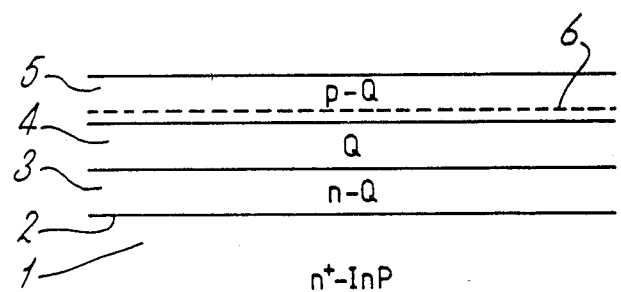
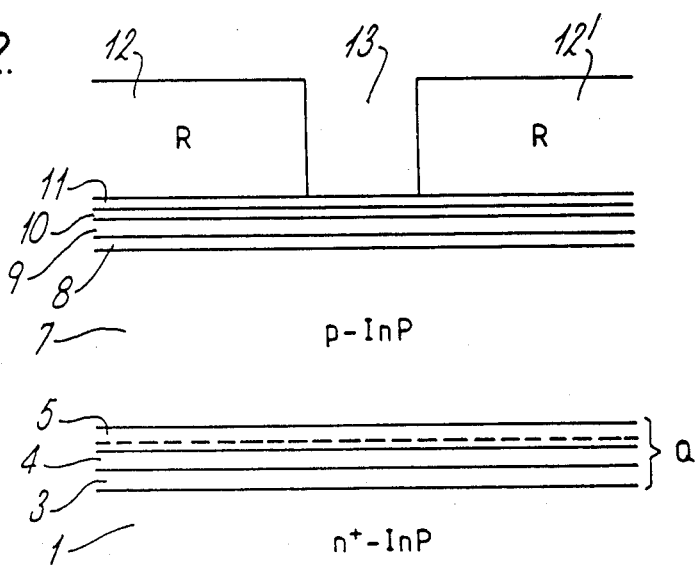
Fig.2.

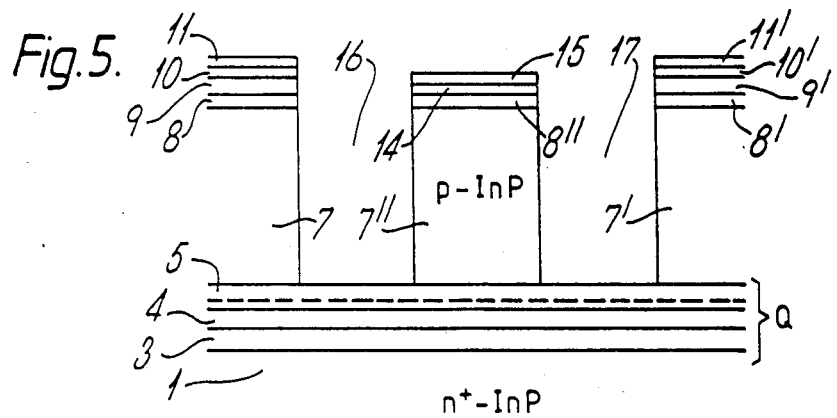
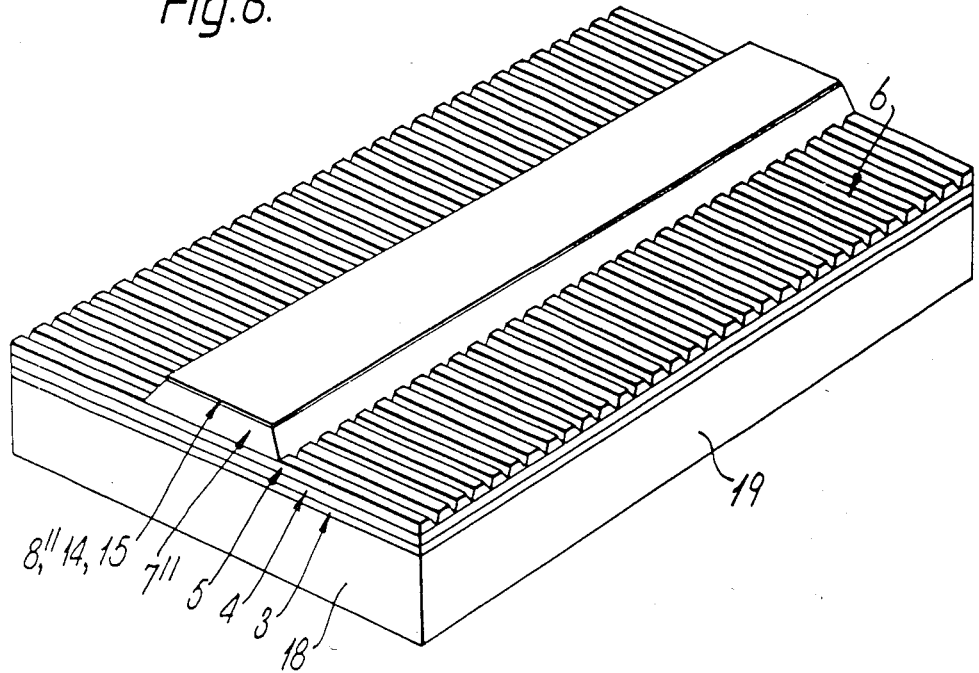

4 μm

RIDGE WAVEGUIDE OPTICAL DEVICES

This is a division of application Ser. No. 709,196 filed Mar. 7, 1985, which is now U.S. Pat. No. 4,728,628.

FIELD OF THE INVENTION

The present invention relates to semiconductor devices, especially those which are known generally as ridge waveguide optical devices such as ridge waveguide lasers.

BACKGROUND OF THE INVENTION

Semiconductor laser structures include a p-n junction across which current flows (the conventional current from p to n) and an "active layer" in which electrons and holes combine with the production of photons by stimulated emission. The active layer has to relate suitably in band gap and refractive index to the other semiconductor regions of the structure in order to achieve a suitable degree of "confinement" of these processes to the active layer. The layers of material to either side of the active layer and in contact with the opposite faces of the active layer are known as "confinement layers".

A major field of application of semiconductor optical devices is in optical fibre communications systems. Silica optical fibres as produced in recent years have loss minima at 1.3 μm and 1.55 μm approximately, the latter minimum being the deeper. Accordingly, there is an especial need for devices operating in the range from 1.1 to 1.65 μm, especially from 1.3 to 1.6 μm. (These wavelengths, like all the wavelengths herein except where the context indicates otherwise, are in vacuo wavelengths.) Semiconductor lasers operating in this region of the infrared usually comprise regions of indium phosphide and of quaternary materials indium gallium arsenide phosphides ($In_xGa_{1-x}As_yP_{1-y}$). By suitable choices of x and y it is possible to lattice-match the various regions while varying the band gaps of the materials. (Band gaps can be determined experimentally by, for example, photoluminescence.) Additionally, both indium phosphide and the quaternary materials can be doped to be p- or n-type as desired.

Semiconductor lasers comprising regions of gallium aluminium arsenide and gallium arsenide are also used for communications purposes. These operate near to 0.9 μm.

Ridge waveguide lasers have been previously described, for example, in the following publications of Kaminow and his coworkers: Electronics Letters, 1979, volume 15, pages 763–765; Electronics Letters, 1981, volume 17, pages 318–320; Electronics Letters, 1983, volume 19, pages 877 to 879. The ridge of the ridge waveguide laser is present to afford transverse optical beam confinement. However, we believe that in practice the particular structure favored by Kaminow and his coworkers, involving electrical contact with the ridge through a window in a dielectric layer covering the ridge and the valleys to either side of the ridge, makes for low yields of devices having narrower ridges (i.e. of those devices having better transverse confinement performance in principle).

In West German Offenlegungsschrift No. 2422287, of Siemens AG, a ridge waveguide laser is described wherein electrical contact with the ridge is made through a window in semiconductor material made resistive by bombardment with protons. However, again we believe that in practice this structure makes for low yields of devices having narrower ridges.

An advantage of ridge waveguide devices is that they are capable of high modulation speeds (see in particular the 1983 paper cited above), and this is of course desirable for communications purposes, permitting a higher data transmission rate other things being equal.

Longitudinal mode control is another important factor in semiconductor laser design. In general, a laser will end to operate in several longitudinal modes corresponding to differing emission wavelengths, whereas both for telecommunications and for other purposes it is often desirable that the laser power should be concentrated into a very narrow wavelength range. In the case of telecommunications systems with silica fibres, logitudinal mode control is especially important for operation near 1.55 μm where the dispersion in the fibre is usually much greater than near 1.3 μm. Moreover, Fabry-Perot lasers are in practice difficult to incorporate in integrated optics structures.

Longitudinal mode control to avoid such problems can be achieved by means of a diffraction grating. One laser structure incorporating a diffraction grating is known as the distributed feedback (DFB) laser (see G. H. B. Thompson, Semiconductor Lasers, Wiley, 1980). In these, the p-n junction across which the current flows lies beneath or above the diffraction grating (in contrast to "Bragg" lasers where the said junction is not beneath the grating). (Here, and throughout this specification, terms such as "beneath", "above", "up", "elevated", etc. are to be taken to indicate merely a reference direction and not the actual orientation of a device in space.)

DFB lasers employing some variant of the buried heterostructure have been described, e.g. by Utaka et al, Electronics Letters, 1981, volume 17, pages 961 to 963; by Itaya et al, 1982, volume 18, pages 1006 to 1008; and by Kitamura et al, Electronics Letters, 1983, volume 19, pages 840 to 841. The buried heterostructure affords transverse optical confinement and gives operation at low threshold currents. Stable operation in a single longitudinal mode up to output powers of 38 mW has been observed. However, the production of satisfactory buried heterostructures involves a complex series of precise growth and etching steps, which makes for low yields of good devices. Moreover, we believe that the various reverse-biased current-blocking layers in such structures are associated with parasitic capacitances that limit the modulation rate.

SUMMARY OF THE INVENTION

The present invention in its various aspects has as its object to alleviate or overcome disadvantages in the prior art devices.

In a first aspect, the present invention provides a semiconductor device comprising a base semiconductor portion and, thereon, first and second elevated semiconductor portions separated by a channel, wherein the uppermost surface of the first elevated semiconductor portion carries a layer of metal in electrical contact therewith, the uppermost surface of the second elevated semiconductor portion has deposited thereon a layer of dielectric, and the surfaces defining the channel are substantially free of metal and dielectric.

In a second aspect, the present invention provides a method of producing a semiconductor device, which device comprises a base semiconductor portion and, thereon, first and second elevated semiconductor portions spaced apart, the uppermost surface of the first elevated semiconductor portion carrying a layer of metal in electrical contact therewith and the uppermost surface of the second elevated semiconductor portion carrying a layer of dielectric, which method comprises applying an etchant to an initial semiconductor structure carrying layers of metal and dielectric on corresponding regions of its surface so as to remove the semiconductor material between said regions. Preferably there is in the initial semiconductor structure a boundary between materials of different etchability corrresponding to the boundary between the base semiconductor portion and the elevated semiconductor portions.

In the first and second aspects, a distributed feedback grating may advantageously be provided beneath said first elevated semiconductor portion.

In a third aspect, the present invention provides a semiconductor device which comprises a base semiconductor portion and, thereon, an elevated semiconductor portion, the uppermost surface of the elevated semiconductor portion carrying a layer of metal in electrical contact therewith, and which includes a distributed feedback grating within or beneath said elevated semiconductor portion. For many practical applications, a second elevated semiconductor portion carrying a layer of dielectric will also be provided on the base semiconductor portion, separated from the first by a channel.

In all three aspects, the first elevated semiconductor portion is most especially, for many practical applications, elongate, i.e. a ridge. Further, an especially important case is where a third as well as a second elevated semiconductor portion is provided on said base semiconductor portion, said third elevated semiconductor portion being separated from the first elevated semiconductor portion by a channel, or spaced therefrom, and carrying a layer of dielectric on its uppermost surface. In a most especially advantageous structure, the first elevated semiconductor portion is a ridge with the second and third elevated semiconductor portions to either side. If, further, a distributed feedback grating is present, then the corrugations of this suitably run substantially at right angles to the ridge and conveniently extend within or beneath the second and/or third elevated portions.

It will be appreciated that in the devices provided by the present invention or produced in accordance therewith the first elevated semiconductor portion can be used to provide a confined current flow in the base portion. Additionally, there is a direct optical confining effect in the base portion. For the confining effect to be substantial in optical devices, the first elevated semiconductor portion is likely to have a width of not more than about 15 μm, preferably of not more than 10 μm, especially of not more than 5 μm. Usually, the width will be at least 1 μm, commonly 2 μm or more. If the fragility of such a structure is considered, it will be appreciated that in practice the contact and heat sink to which the metal layer on the first elevated semiconductor portion is bonded will also usually have to contact the second and third elevated semiconductor portions if present; and the significance of the dielectric layers on these latter portions is therefore apparent if current confinement to the ridge and thereby (to a diminished extent) in the base portion is to be achieved.

A layer of metal may be present on the layer of dielectric on the second and third elevated semiconductor portions. This metal is not in electrical contact with the semiconductor and therefore, when the device is bonded by its top surfaces to a heat sink and electrical contact such as a copper stud, current flows only into the first elevated semiconductor portion. On the other hand, the presence of the metal facilitates the bonding. Further, if the metal is present on top of the dielectric when devices are fabricated by the method provided by the invention in its second aspect it may afford useful additional resistance to the etchant used.

It may be especially convenient to achieve good contact to use two layers of metal on top of the layers of dielectric on the second and third semiconductor portions, e.g. of titanium and then gold or zinc and then gold.

A convenient method of producing the initial semiconductor structure to be used in the method provided by the present invention in its second aspect involves the following steps: (i) depositing dielectric, then optionally metal, and then resist onto a planar semiconductor surface; (ii) opening a window in the resist over a region corresponding to the uppermost surface of the first elevated portion; (iii) employing a suitable reagent to undercut the resist down to the level of the semiconductor surface; (iv) depositing metal onto the semiconductor surface thus exposed in the image of the window of the resist; and (v) removing the resist and any metal deposited thereon. The metal deposited on the semiconductor surface in step (iv) is spaced from the dielectric layer by the extent of the undercut achieved in step (iv). A technique having certain similarities to this was described some years ago in UK Pat. No. 1 475 884, but primarily in a very different context (magnetic bubble stores).

In optical devices in accordance with or produced in accordance with the present invention the base portion may include a semiconductor active layer and confinement layers respectively on the upper and lower sides. In some cases, an upper confinement layer can be omitted from the base portion if the material of the first elevated semiconductor portion is suitable to function as a confinement layer. As a further possibility, the active layer and one or both of the confinement layers may be included in the first elevated semiconductor portion.

If distributed feedback corrugations are required, these may be above or below the active layer at an interface involving a suitable refractive index discontinuity, especially at the outer face of a confinement layer. We have found it especially convenient to place the corrugations in the upper face of the upper confinement layer.

A system of materials which we have found especially convenient for the semiconductor base portion, in ascending order, is indium phosphide, a lower confinement layer of indium gallium arsenide phosphide, an active layer of indium gallium arsenide phosphide, and an upper confinement layer of indium gallium arsenide phosphide. The elevated semiconductor portions can advantageously comprise, in ascending order, a layer of indium phosphide and then a layer of highly doped indium gallium arsenide or indium gallium arsenide phosphide (the latter layer being a cap layer to facilitate low electrical resistance contact to the layer of metal).

The present invention in its three aspects will now be illutrated by means of the following Example 1, and in its first and second aspects by the following Example 2. The Examples in turn refer to the accompanying Figures.

BRIEF DESCRIPTION OF THE DRAWINGS

FIGS. 1 to 10 relate to Example 1 and FIGS. 11 and 12 relate to Example 2 as follow:

FIGS. 1 to 5 are a series of sections in the same plane showing the stages in the production of a device, FIG. 5 being a section of the upper part of a finished device. The Figures are schematic and not necessarily to scale. Hatching lines are omitted.

FIG. 6 is a partial exploded perspective view of the device showing in particular the relation of the distributed feedback corrugations to the ridge. Like FIGS. 1 to 5, FIG. 6 is schematic and not necessarily to scale.

FIG. 7 is an electron microscope photograph of a device.

FIG. 8 shows the continuous wave (CW) light output-versus-current characteristic of a device.

FIG. 9 shows the CW emission spectrum of a device.

FIG. 10 shows the oscilloscope trace obtained in preliminary speed measurements on a device.

EXAMPLE 1

Figure 3:
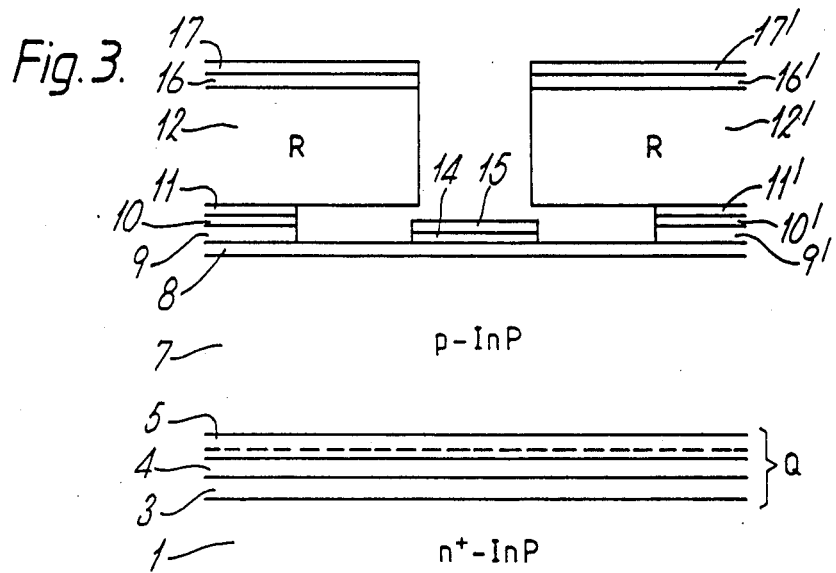

This example describes the production and testing of a range of distributed feedback ridge waveguide lasers.

The first stages in the production of the devices, as far as the section shown in FIG. 1, are as follows. Onto the (100) face (2 in FIG. 1) of a heavily S-doped InP (n+-type) substrate 1 approximately 200 μm thick were grown by liquid phase epitaxy (LPE) a series of three layers of quaternary materials 3, 4, and 5 each 0.2 μm thick. Layer 3 is Te-doped (n-type) of nominal composition $Ga_{0.17}In_{0.83}As_{0.36}P_{0.64}$ of band gap equivalent 1.15 μm as determined by photoluminescence. Layer 4 is undoped material of nominal composition $Ga_{0.39}In_{0.61}As_{0.88}P_{0.12}$ of nominal band gap equivalent 1.52 μm. Layer 5 is similar to layer 3 except that it is Zn-doped (p-type). Layer 4, it will be appreciated, is the active layer in the finished device and layers 3 and 5 are the lower and upper confinement (or "buffer") layers.

Next, layer 5 was corrugated by chemical etching through an electron-beam-exposed resist mask in the manner described by Westbrook et al, Electronics Letters, 1982, volume 18, pages 863–865. The distributed feedback corrugations 6 are second-order of nominal period 0.46 μm, running in the <110> direction, the etching being self-limiting and resulting in triangular grooves with (111)A side walls. The grooves are approximately 0.16 μm deep. The self-limiting nature of the etching process makes for reproducibility and control of the laser feedback strength.

Then corrugated layer 5 was overgrown with a layer 7 Zn-doped (p-type) indium phosphide by atmospheric pressure metal organic chemical vapour deposition (MOCVD) while maintaining the integrity of the gratings as previously described (European patent application No. 84.300240.3 and also Nelson et al., Electronics Letters, 1983, volume 19, pages 34 to 36). To achieve this, trimethylindium, triethylphosphine, dimethylzinc, phosphine, and hydrogen were passed over the sample at 100° C. and the sample was heated rapidly to 650° C. whereupon growth occurred. Layer 7 was approximately 1.5 μm thick.

Then, also by MOCVD, a layer 8 approximately 0.1 μm thick of heavily Zn-doped (p+-type) ternary material was grown. The material had the nominal composition $In_{0.53}Ga_{0.47}As$.

To complete the structure of FIG. 1, a layer 9 of silica, 0.2 μm thick, was grown on top of layer 8 by chemical vapour deposition from silane and oxygen.

Then the substrate was thinned to 100 μm by chemical etching, and the back contact of the laser (i.e. the contact on the underside of thinned layer 1) was made by evaporation of tin and gold and subsequent alloying.

The immediately subsequent treatment of the upper layers, as far as FIG. 2, was as follows. 0.1 μm of titanium (layer 10) and 0.1 μm of gold (layer 11) were evaporated onto the silica layer 9. Then about 1 μm of a positive resist Kodak 820 (a detailed description of which may be found in Kodak Micro Positive Resist 820), published by Kodak, 1982 was applied to the gold and a dark field mask at right angles to the grating was used to make a stripe window 13 between areas of resist 12 and 12'. Windows of 2 μm, 4 μm, 6 μm, and 15 μm were made on a single wafer.

The steps as far as FIG. 3 were as follows. The structure was exposed to an solution of potassium iodide (4 g) and iodine (1 g) in 40 ml of water at 20° C. for 1 to 1½ minutes (which etchant attacks gold layer 11) and to "Countdown silicon dioxide etch (10:1)" for 2 to 2½ minutes at 20° C. (which etchant attacks titanium layer 10 and silica layer 9). The result was an undercut etching down to the top layer 8 of semiconductor material. By exposing this sequentially to filaments of evaporating titanium and gold, an image 14, 15 of the window was obtained on the exposed semiconductor. At the same time, titanium layers 16, 16' and gold layers 17, 17' were deposited on top of the resist 12, 12'. The wire filaments used were 10 cm away from the target and the thickness of each metal deposited was about 0.1 μm.

Figure 4:
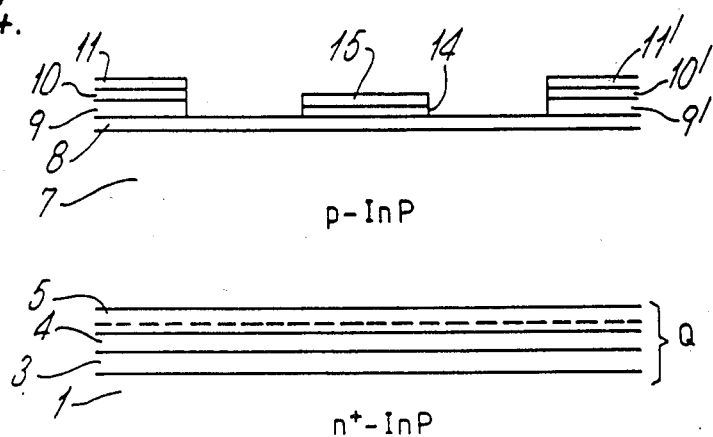

Then the structure shown in FIG. 3 was soaked in acetone for two minutes so as to remove the resist 12, 12' and therewith layers 16, 16', 17, and 17'. The result as shown in FIG. 4 is an "initial semiconductor structure" as referred to with respect to the second aspect of the invention carrying two sequential layers of metal comprising sub-layers 14 and 15 and separate layers of dielectric 9 and 9', which latter are themselves in this case overlaid with metal 10 and 11 and 10' and 11'. The distance between the edges of the metal layers 14, 15 and the edge of the dielectric 9, 9' was approximately 4 μm. By treating this structure with 16 weight percent aqueous $HIO_3$ at 20° C. for 20 seconds to 1 minute (to attack ternary layer 8) and then with a 1:1 mixture by volume of concentrated hydrochloric acid and 90 percent orthophosphoric acid at 20° C. for 30 to 40 seconds (to attack indium phosphide layer 7 without appreciably attacking quaternary layer 5), the result shown in FIG. 5 is achieved.

In FIG. 5, the etching through layers 8 and 7 has been shown as vertical, although in practice this is unlikely to be the case. It will be seen that, in the terminology previously used, the base semiconductor portion is constituted by layers 1, 3, 4, and 5; the first elevated semiconductor portion (constituting the ridge of the laser) by 7" and 8"; the second elevated semiconductor portions by 7 and 8; and the third by 7' and 8'. It will be noted that while the first such portion carries metal layers titanium 14 and gold 15 in electrical contact therewith the other portions carry the dielectric silica 9 and 9'. The insides of channels 16, 17 are substantially free of dielectric and metal.

Figure 7:
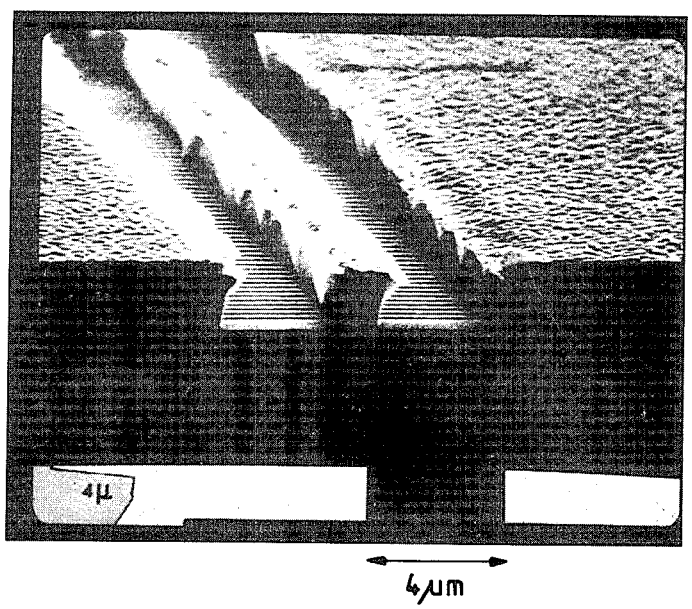

As is conventional, all the steps above were in fact performed on a wafer which was then cut up to yield several devices, a single such device being shown schematically in FIG. 6. In FIG. 6, the second and third elevated semiconductor portions are omitted so as to show clearly the relative orientation of the ridge and the grating. The reference numerals up to 15 have the same significance as previously. Facet 18 of the device is a cleaved facet, the other three side facets such as 19 being scribed so as to suppress Fabry-Perot laser modes other than the mode selected by the DFB grating. The slope of the sides of the ridge in FIG. 6 is arbitrarily drawn; in practice they may slope in the opposite direction, as is shown by the photograph of a device in FIG. 7.

The devices were mounted for testing by soldering them with indium onto the rectangular face of a hemicylindrical gold-plated heat sink and contact stud, the "upper" surfaces 11, 15, and 11' in FIG. 5 being in such soldered contact. By virtue of the silica layers 9 and 9', however, only the ridge 7", 8" was thereby brought into electrical contact with the stud. (Indium was not allowed to flow into channels 16 and 17). A soldered contact to the metallisation on the "underside" of the base portion was made.

Figure 8:
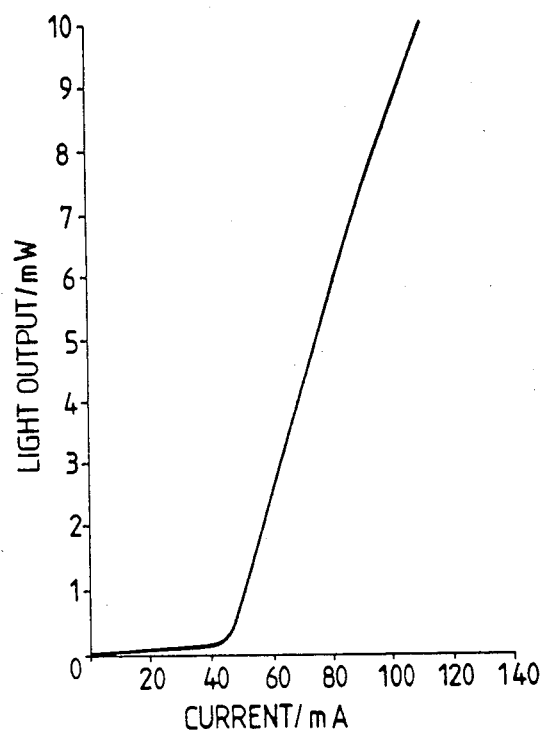

To test the devices, a positive potential difference was applied between the stud and the back contact and the light emission from cleaved face 18 was monitored. FIG. 8 shows the result obtained for one device 300 μm long with a ridge 2 μm wide operating continuous-wave at 20° C. It will be seen that the threshold current was about 45 mA. The highest differential quantum efficiency was 27 percent from one facet, and the maximum continuous output power was approximately 15 mW.

Figure 9:
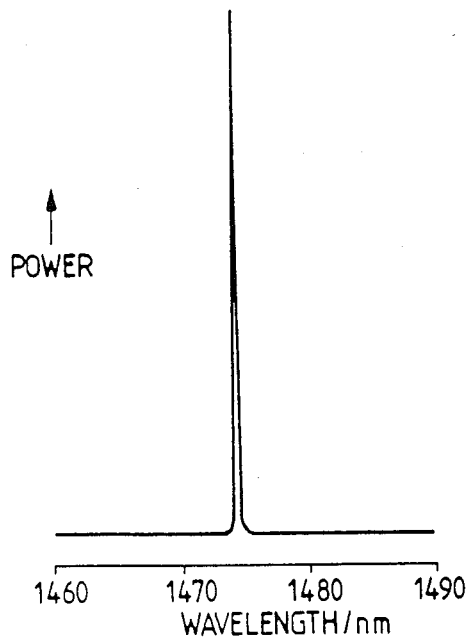

As FIG. 9 shows, the output power of a laser was wholly contained in a single longitudinal mode corresponding to an emission wavelength near to 1.48 μm. As the laser current and output power were increased, the spectrum remained unaltered except for a gradual shift in emission wavelength because of the associated rise in temperature of the active layer.

Preliminary speed measurements were performed by pre-biasing devices at threshold and applying a short (approximately 3 ns) 50 mA current pulse via a 50 ohm line (10 to 90 percent rise time≃90 to 10 percent fall time <200 ps). The laser light output was detected with an indium gallium arsenide p-i-n photodiode (see R H Moss et al., Brtish Telecom Journal, 1983 volume 1, pages 7 to 22) and sampled with a Textronix 56 Sampling Head (rise time constant <30 ps). A photograph of the oscilloscope trace is displayed in FIG. 4. The 90 percent to 10 percent fall time thus measured was <750 ps. In fact, this is very much an upper limit estimate of the performance of the device per se since the contacts were reactive to an unknown degree and no attempt was made to compensate for this. In contrast, a fall-time of >1 ns has been measured for long wavelength double channel planar buried heterostructure (DC-PBH) Fabry-Perot lasers. This is believed to offer considerable promise for high speed DFB laser applications.

EXAMPLE 2

A Fabry-Perot ridge waveguide laser was made in the same manner as in Example 1, except that no distributed feedback grating was incorporated and as a result LPE was chosen for the growth of all the semiconductor layers (MOCVD having been chosen in Example 1 as a means of avoiding deformation of the DFB corrugations during overgrowth).

Figure 10:
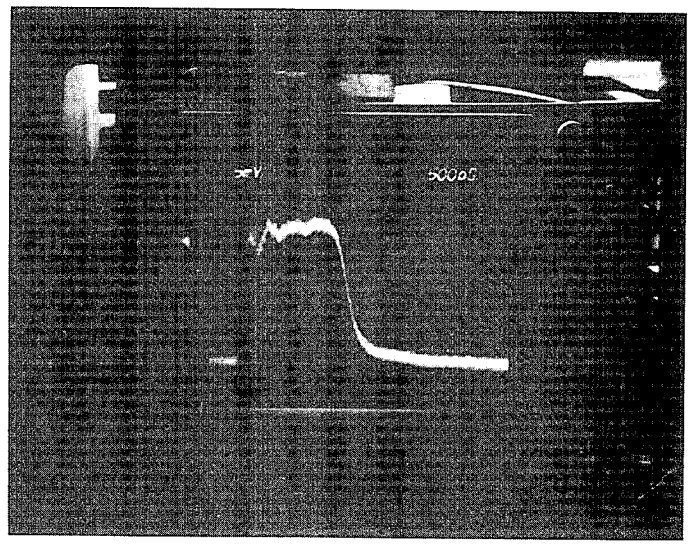
Figure 11:
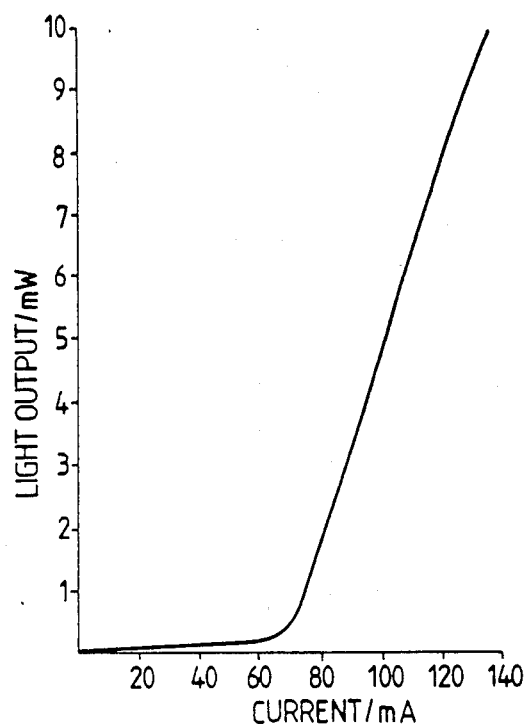
FIG. 11 is the light output-versus-current characteristic of the device made in accordance with Example 2.

The characteristics of the laser were determined as in Example 1, and the results are displayed in FIGS. 10 and 11, of which:

FIG. 11 is the light output-versus-current characteristic of the device, and

Figure 12:
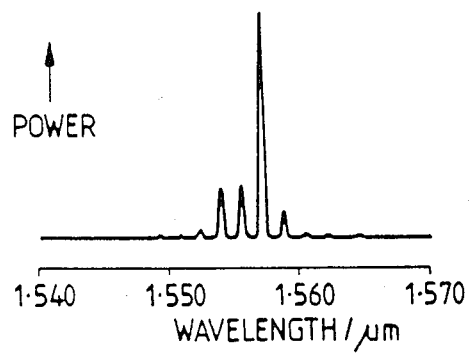
FIG. 12 is the emission spectrum of the device made in accordance with Example 2.

FIG. 12 is the emission spectrum of the device made in accordance with example 2.

It will be seen from FIG. 12 that in the absence of the DFB grating several modes are observed.

We claim:

1. A ridge waveguide optical semiconductor device comprising a base semiconductor portion and, thereon, first and second elevated semiconductor portions separated by a channel, wherein the uppermost surface of the first elevated semiconductor portion carries a layer of metal in electrical contact therewith, the uppermost surface of the second elevated semiconductor portion has deposited thereon a layer of dielectric, and the surfaces defining the channel are substantially free of metal and dielectric, said device having a grating disposed therein.

2. A device according to claim 1, having a third elevated semiconductor portion separated from the first elevated semiconductor portion by a channel and carrying a layer of dielectric on its uppermost surface.

3. A device according to claim 1 or claim 2, wherein the dielectric layer or dielectric layers carry a layer of metal.

4. A device according to claim 1 or 2 wherein the semiconductor base portion includes in sequential face contact a lower semiconductor confinement layer, semiconductor active layer, and an upper semiconductor confinement layer.

5. A device according to any of claims 1 or 2, wherein said grating is provided within or beneath said first elevated semiconductor portion.

6. A device according to any of claims 1 or 2, wherein the first elevated semiconductor portion has a width of less than 15 μm.

7. A device according to claim 6, wherein the width is less than 5 μm.

8. A device according to any of claim 1 or 2 wherein the first elevated semiconductor portion comprises indium phosphide and wherein the base portion includes an active layer of gallium indium arsenide phosphide.

9. A ridge waveguide semiconductor device comprising a base semiconductor portion, an elevated ridge waveguide disposed on the base semiconductor portion, and having an upper surface having a layer of metal in electrical contact therewith, and a grating disposed in at least a portion of the device aligned beneath said upper surface of the ridge waveguide.

10. A semiconductor device according to claim 9, further comprising at least one further elevated semiconductor portion disposed on the base portion, and separated from said first elevated semiconductor portion by a channel, said at least one further elevated semiconductor portion having an upper surface provided with a layer of dielectric material.

11. A semiconductor device according to claim 10 wherein said grating extends within or beneath the second elevated portion.

12. The semiconductor device of claim 9 in which the ridge waveguide has a width in the range of 1 micron to 15 microns.

13. The semiconductor device of claim 9 in which the device is a semiconductor distributed feedback laser and the grating is a periodic corrugation in a confinement layer boundary.

14. A ridge waveguide semiconductor device comprising a plurality of layers providing a base semiconductor portion, an elevated ridge waveguide portion disposed on the base semiconductor portion, a light generating active region and means for confining light with respect to the active region, said means for confining comprising confinement layers above and belo said active layer for confinement perpendicular to said layers, said ridge waveguide providing lateral confinement transverse the ridge, and a grating for providing longitudinal mode control in a lengthwise direction of the ridge.

15. The semiconductor device of claim 14 in which the ridge has a width in the range of one to fifteen microns and the device further comprises at least one further elevated portion separated from the ridge by a channel.

16. The semiconductor device of claim 15 in which the ridge waveguide has an upper surface provided with layer of metal in electrical contact therewith and the further elevated portion has an upper surface provided with a layer of dielectric material.

17. The semiconductor device of claim 16 in which the channel separating the ridge waveguide and the further elevated portion is substantially free from metal and dielectric layers.

18. The semiconductor device of claim 14 in which the device is a distributed feedback laser and the grating is disposed on the upper surface of the base semiconductor portion.

19. The semiconductor device of claim 14 in which the active layer is within the base semiconductor portion and comprises gallium indium arsenide phosphide and the ridge waveguide comprises gallium phosphide.

* * * * *